United States Patent
Lu et al.

(10) Patent No.: US 11,067,608 B2
(45) Date of Patent: Jul. 20, 2021

(54) CURRENT SENSOR AND FREQUENCY COMPENSATION METHOD THEREOF

(71) Applicant: Novatek Microelectronics Corp., Hsinchu (TW)

(72) Inventors: Chih-Wen Lu, Hsinchu (TW); Chih-Hao Lin, Hsinchu (TW); Jhih-Siou Cheng, New Taipei (TW); Chieh-An Lin, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 46 days.

(21) Appl. No.: 16/441,027

(22) Filed: Jun. 14, 2019

(65) Prior Publication Data

US 2020/0393498 A1    Dec. 17, 2020

(51) Int. Cl.
*G01R 17/00* (2006.01)
*G01R 19/00* (2006.01)
*H03F 3/45* (2006.01)

(52) U.S. Cl.
CPC ..... *G01R 19/0092* (2013.01); *H03F 3/45475* (2013.01); *H03F 2200/129* (2013.01); *H03F 2203/45116* (2013.01); *H03F 2203/45512* (2013.01)

(58) Field of Classification Search
CPC .. G01R 15/183; G01R 15/202; G01R 15/207; G01R 15/14; G01R 15/20; G01R 19/0092; G01R 13/02; G01R 21/08; G01R 11/32; G01R 33/18; G01R 33/02
See application file for complete search history.

(56) References Cited

U.S. PATENT DOCUMENTS

| | | | | |
|---|---|---|---|---|
| 5,986,497 A * | 11/1999 | Tsugai | ..... | G01D 5/24 327/554 |
| 8,921,755 B2 * | 12/2014 | Ricard | ..... | H04N 5/3745 250/214 A |
| 2008/0122454 A1 * | 5/2008 | Kato | ..... | G01D 3/032 324/661 |
| 2009/0319210 A1 * | 12/2009 | Yanagisawa | ..... | G01R 17/06 702/64 |
| 2012/0218223 A1 * | 8/2012 | Erdogan | ..... | G06F 3/0446 345/174 |
| 2017/0254837 A1 * | 9/2017 | Boden | ..... | G01R 19/0092 |

* cited by examiner

*Primary Examiner* — Thang X Le
(74) *Attorney, Agent, or Firm* — JCIPRNET

(57) ABSTRACT

A current sensor including a voltage generation circuit and a voltage integration circuit is provided. The voltage generation circuit is configured to generate a first voltage according to a current to be sensed. The voltage integration circuit is coupled to the voltage generation circuit and configured to receive the first voltage and a second voltage to generate an output voltage. The voltage integration circuit includes a first amplifier, a second amplifier and a first capacitor. The first amplifier is configured to receive the first voltage and the second voltage to generate a third voltage. The second amplifier is coupled to the first amplifier and configured to receive the third voltage to generate the output voltage. The first capacitor is coupled between an output terminal of the voltage generation circuit and an output terminal of the first amplifier and configured to reduce a voltage difference between the first voltage and the second voltage.

20 Claims, 4 Drawing Sheets

CURRENT SENSOR AND FREQUENCY COMPENSATION METHOD THEREOF

BACKGROUND

Field of the Invention

The invention relates to a current sensor and more particularly, to a current sensor and a frequency compensation method thereof.

Description of Related Art

In a technical field related to current sensing, a current sensor usually compensates a frequency by using an integrator. However, in a current technique, the current sensor, when sensing a current of a device to be measured, has two inaccurate conditions described as follows.

An input terminal of the integrator has a voltage change in an integration phase, this voltage change causes a change to a current size of the device to be measured and also causes a change to a voltage on a stray capacitor inside the device to be measured, and the current partially flows to the ground through the stray capacitor, instead of entirely flowing into the current sensor. In addition, the voltage change of the input terminal of the integrator is equal to a change of input voltages of a differential pair. This voltage change results in a reduced transconductance of the differential pair and a reduced gain of an operational amplifier, thereby influencing an accuracy of the current sensor. Accordingly, how to increase the accuracy of the current sensor sensing the current has become an important subject to this field.

SUMMARY

The invention provides a current sensor and a frequency compensation method thereof capable of increasing an accuracy of the current sensor sensing a current.

A current sensor of the invention includes a voltage generation circuit and a voltage integration circuit. The voltage generation circuit is configured to generate a first voltage according to a current to be sensed. The voltage integration circuit is coupled to the voltage generation circuit, and configured to receive the first voltage and a second voltage to generate an output voltage. The voltage integration circuit includes a first amplifier, a second amplifier and a first capacitor. The first amplifier is configured to receive the first voltage and the second voltage to generate a third voltage. The second amplifier is coupled to the first amplifier, and configured to receive the third voltage to generate the output voltage. The first capacitor is coupled between an output terminal of the voltage generation circuit and an output terminal of the first amplifier, and configured to reduce a voltage difference between the first voltage and the second voltage.

In an embodiment of the invention, the voltage integration circuit further includes a second capacitor and a switch. The second capacitor is coupled between the output terminal of the voltage generation circuit and an output terminal of the second amplifier. The switch is coupled between the output terminal of the voltage generation circuit and the output terminal of the second amplifier.

In an embodiment of the invention, the switch is in a turned-on state when the voltage integration circuit is operated in a reset phase, and the switch is in a turned-off state when the voltage integration circuit is operated in an integration phase.

In an embodiment of the invention, when the switch is in the turned-on state, the output terminal of the second amplifier is connected to the output terminal of the voltage generation circuit to form a negative feedback loop, and the first capacitor is connected to the output terminal of the second amplifier through the turned-on switch to form a Miller compensation.

In an embodiment of the invention, when the switch is in the turned-off state, the first capacitor and the second capacitor are connected in series between an input terminal and the output terminal of the second amplifier to form the Miller compensation.

In an embodiment of the invention, the switch is a resistor.

In an embodiment of the invention, the first amplifier is a differential amplifier having a positive input terminal and a negative input terminal, the negative input terminal receives the first voltage, and the positive input terminal receives the second voltage.

In an embodiment of the invention, wherein the second amplifier is a single output amplifier having an inverting gain and having a negative input terminal, and the negative input terminal is coupled to the output terminal of the first amplifier.

In an embodiment of the invention, the voltage generation circuit includes a current source, a resistor and a third capacitor, a terminal of the current source is coupled to a working voltage, another terminal of the current source is coupled to a terminal of the resistor and a terminal of the third capacitor, another terminal of the third capacitor is coupled to a ground voltage, and another terminal of the resistor is coupled to the voltage integration circuit.

In an embodiment of the invention, the current sensor is applied to a display panel.

A frequency compensation method of a current sensor of the invention includes: generating a first voltage according to a current to be sensed by a voltage generation circuit; and receiving the first voltage and a second voltage by a voltage integration circuit coupled to the voltage generation circuit to generate an output voltage. The step of receiving the first voltage and the second voltage by the voltage integration circuit to generate the output voltage includes: receiving the first voltage and the second voltage by a first amplifier to generate a third voltage; receiving the third voltage by a second amplifier coupled to the first amplifier to generate the output voltage; and reducing a voltage difference between the first voltage and the second voltage by a first capacitor coupled between an output terminal of the voltage generation circuit and an output terminal of the first amplifier.

In an embodiment of the invention, the voltage integration circuit further includes a second capacitor and a switch. The second capacitor is coupled between the output terminal of the voltage generation circuit and an output terminal of the second amplifier. The switch is coupled between the output terminal of the voltage generation circuit and the output terminal of the second amplifier.

In an embodiment of the invention, the switch is in a turned-on state when the voltage integration circuit is operated in a reset phase, and the switch is in a turned-off state when the voltage integration circuit is operated in an integration phase.

In an embodiment of the invention, when the switch is in the turned-on state, the output terminal of the second amplifier is connected to the output terminal of the voltage generation circuit to form a negative feedback loop, and the first capacitor is connected to the output terminal of the second amplifier through the turned-on switch to form a Miller compensation.

In an embodiment of the invention, when the switch is in the turned-off state, the first capacitor and the second capacitor are connected in series between an input terminal and the output terminal of the second amplifier to form the Miller compensation.

In an embodiment of the invention, the switch is a resistor.

In an embodiment of the invention, the first amplifier is a differential amplifier having a positive input terminal and a negative input terminal, the first voltage is received by the negative input terminal, and the second voltage is received by the positive input terminal.

In an embodiment of the invention, the second amplifier is a single output amplifier having an inverting gain and having a negative input terminal, and the negative input terminal is coupled to the output terminal of the first amplifier.

In an embodiment of the invention, the voltage generation circuit includes a current source, a resistor and a third capacitor, a terminal of the current source is coupled to a working voltage, another terminal of the current source is coupled to a terminal of the resistor and a terminal of the third capacitor, another terminal of the third capacitor is coupled to a ground voltage, and another terminal of the resistor is coupled to the voltage integration circuit.

In an embodiment of the invention, the current sensor is applied to a display panel.

To sum up, the embodiments of the invention provides the current sensor and the frequency compensation method that can fix an input voltage to a specific reference voltage via a compensation capacitor, so as to reduce the voltage difference between two input terminals of the voltage integration circuit. In this way, the accuracy of the current sensor sensing the current can be enhanced.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
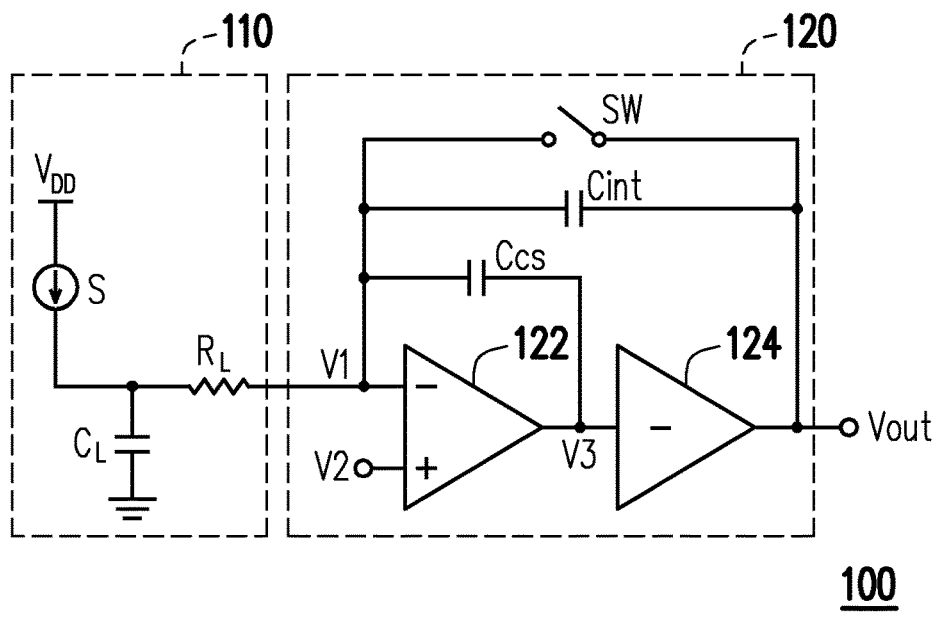
FIG. 1 is a circuit diagram illustrating a current sensor according to an embodiment of the invention.

FIG. 1 is a circuit diagram illustrating a current sensor according to an embodiment of the invention.

Referring to FIG. 1, a current sensor 100 of the present embodiment includes a voltage generation circuit 110 and a voltage integration circuit 120. The voltage integration circuit 120 is coupled to the voltage generation circuit 110. The voltage integration circuit 120 includes an operational amplifier and a compensation capacitor Ccs. Specially, the operational amplifier is a two-stage amplifier including an amplifier 122 and an amplifier 124. The amplifier 122 is a first-stage amplifier of the operational amplifier, and the amplifier 124 is a second-stage amplifier of the operational amplifier. The amplifier 124 is coupled to the amplifier 122, and the compensation capacitor Ccs is coupled between an output terminal of the voltage generation circuit 110 and an output terminal of the amplifier 122.

In an embodiment, the voltage integration circuit 120 further includes an integration capacitor Cint and a switch SW. The integration capacitor Cint is coupled between the output terminal of the voltage generation circuit 110 and the output terminal of the amplifier 124. The switch SW is also coupled between the output terminal of the voltage generation circuit 110 and the output terminal of the amplifier 124.

In an embodiment, the voltage generation circuit 110 includes a current source S, a resistor $R_L$ and a load capacitor $C_L$. A terminal of the current source S is coupled to a working voltage $V_{DD}$, another terminal of the current source S is coupled to a terminal of the resistor $R_L$ and a terminal of the load capacitor $C_L$, another terminal of the load capacitor $C_L$ is coupled to a ground voltage, and another terminal of the resistor $R_L$ is coupled to the voltage integration circuit 120.

It should be specially noted that in an embodiment, the amplifier 122 is a differential amplifier having a positive input terminal (+) and a negative input terminal (−). In an embodiment, the amplifier 124 is a single output amplifier having an inverting gain and having a negative input terminal (−), and the negative input terminal (−) is coupled to an output terminal of the amplifier 122. In an embodiment, the switch SW is a resistor, but the invention is not limited thereto. Additionally, in an embodiment, the current sensor 100 may be applied to a device to be measured which requires an additional voltage thereon for current sensing, and this device to be measured may be a display panel, but the invention is not limited thereto.

Figure 2:
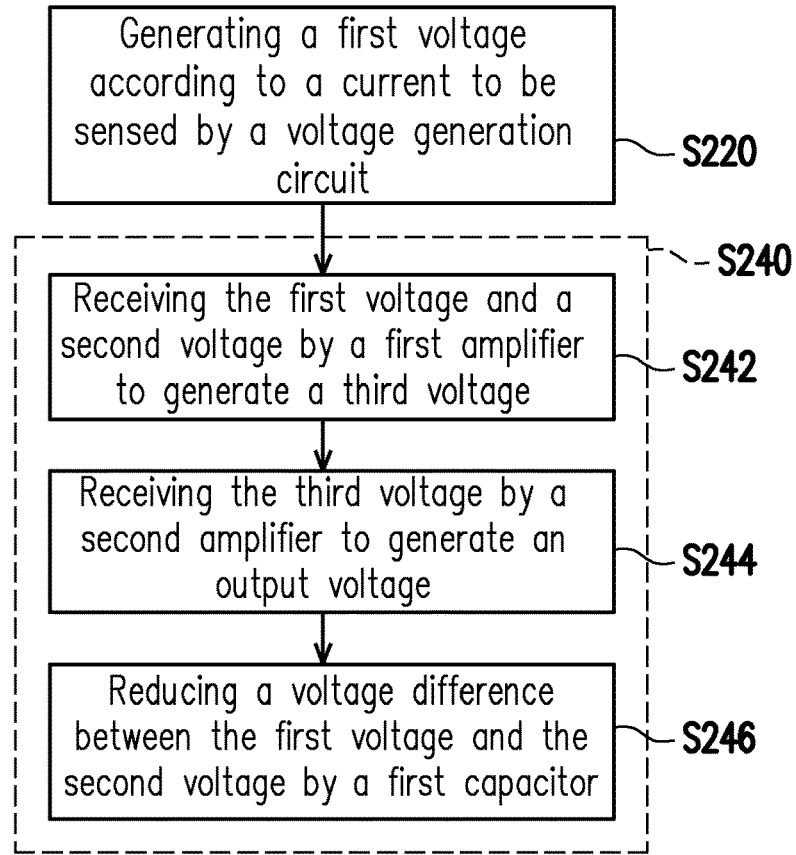
FIG. 2 is a flowchart illustrating a frequency compensation method of a current sensor according to an embodiment of the invention.

FIG. 2 is a flowchart illustrating a frequency compensation method of a current sensor according to an embodiment of the invention. Referring to both FIG. 1 and FIG. 2, a frequency compensation method 200 of the present embodiment is applicable to the current sensor 100 illustrated in FIG. 1.

In step S220, the voltage generation circuit 110 generates a first voltage V1 according to a current to be sensed. In detail, the voltage generation circuit 110 generates a first voltage V1 at the output terminal of the voltage generation circuit 110 according to the current to be sensed generated by the current source S.

In step S240, the first voltage V1 and a second voltage V2 are received by the voltage integration circuit 120 to generate an output voltage Vout. Specifically, in the voltage generation circuit 120, the first voltage V1 is received by the negative input terminal (−) of the amplifier 122, the second voltage V2 is received by the positive input terminal (+) of the amplifier 122, and a third voltage V3 is generated by the output terminal of the amplifier 122 (step S242). Then, the third voltage V3 is received by the negative input terminal (−) of the amplifier 124, and the output voltage Vout is generated by the output terminal of the amplifier 124 (step S244). Further, a voltage difference between the first voltage V1 and the second voltage V2 is reduced via the compensation capacitor Ccs (step S246).

Figure 3A:
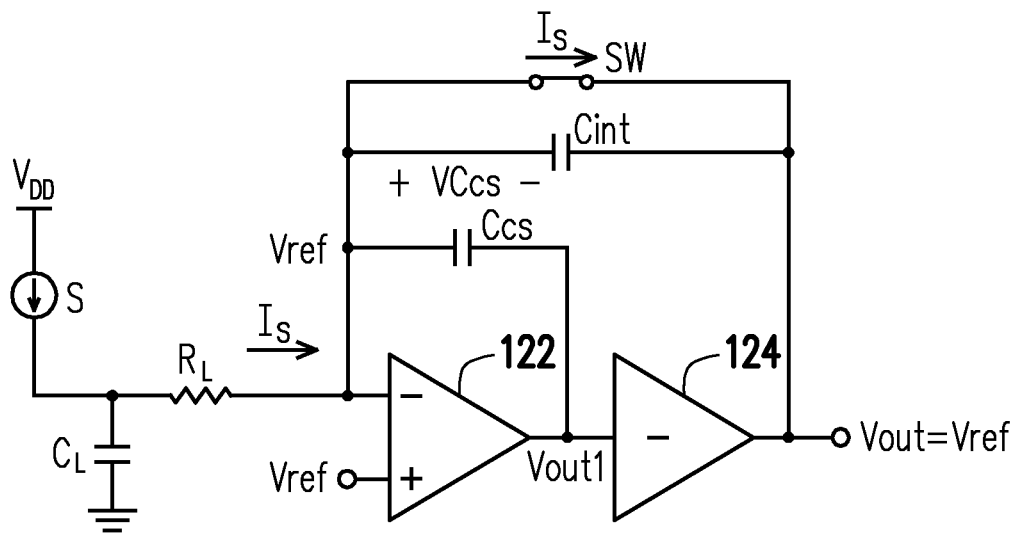
FIG. 3A is a circuit operation diagram illustrating the current sensor when the voltage integration circuit is operated in a reset phase according to an embodiment of the invention.
Figure 3B:
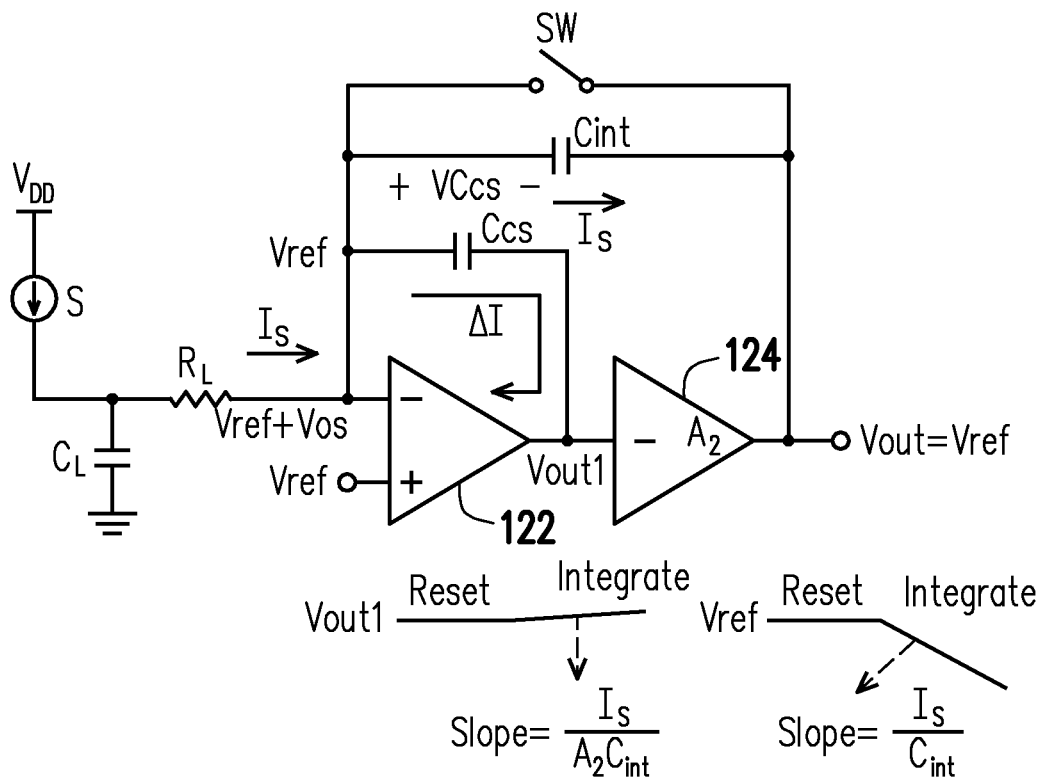
FIG. 3B is a circuit operation diagram illustrating the current sensor when the voltage integration circuit is operated in an integration phase according to an embodiment of the invention.

Operations of the current sensor 100 using the voltage integration circuit 120 are divided into two phases, including a reset phase and an integration phase. FIG. 3A is a circuit operation diagram illustrating the current sensor when the voltage integration circuit is operated in the reset phase according to an embodiment of the invention. FIG. 3B is a circuit operation diagram illustrating the current sensor when the voltage integration circuit is operated in the integration phase according to an embodiment of the invention. In addition, FIG. 3B also illustrates a waveform diagram of an output voltage Vout1 of the amplifier 122 and the output voltage Vout of the amplifier 124 when the voltage integration circuit 120 is operated in the reset phase and the integration phase.

Referring to FIG. 3A, in the present embodiment, when the voltage integration circuit 120 is operated in the reset phase, the switch SW is in a turned-on state. When the switch SW is in the turned-on state, the output terminal of the amplifier 124 is connected to the output terminal of the voltage generation circuit 110 to form a negative feedback loop, the operational amplifier with the negative feedback forms a unit gain buffer amplifier, and the compensation capacitor Ccs is connected to the output terminal of the amplifier 124 through the turned-on switch SW to form a Miller compensation.

Specifically, an end point of the device to be measured is driven by the unit gain buffer amplifier to a voltage Vref, the output voltage Vout of the output terminal of the voltage integration circuit 120 is also Vref, the output voltage of the amplifier 122 is fixed to a certain voltage Vout1, and a current Is of the device to be measured flows through the switch SW and enters an output stage of the operational amplifier.

The current sensor 100, after being reset for a period of time, enters the integration phase. Referring to FIG. 3B, in the present embodiment, when the voltage integration circuit 120 is operated in the integration phase, the switch SW is in a turned-off state. When the switch is in the turned-off state, the operational amplifier forms a closed loop via the integration capacitor Cint, and the compensation capacitor Ccs and the integration capacitor Cint are connected in series between the input terminal and the output terminal of the amplifier 124 to form the Miller compensation.

In detail, the current Is of the device to be measured is input to the negative input terminal (−) of the amplifier 122, and the voltage of the negative input terminal (−) rises, and the rising signal is amplified and output by a first-stage differential amplifier (i.e., the amplifier 122) to the negative input terminal (−) of the second-stage amplifier (i.e., the amplifier 124), which is amplified and output by the second-stage amplifier. Since the second-stage amplifier is an inverting amplifier, a second-stage output voltage falls, and this falling signal is coupled to the negative input terminal (−) of the amplifier 122 via the integration capacitor Cint to stop the voltage of the negative input terminal (−) of the amplifier 122 from rising. As long as the gain of the operational amplifier is high enough, the voltage of the negative input terminal (−) of the amplifier 122 is nearly equal to the voltage Vref, and the current Is of the device to be measured flowing through the integration capacitor Cint enters the output stage of the operational amplifier. If it is assumed that the current Is of the device to be measured is a fixed current and a frequency bandwidth of the operational amplifier is infinite, the output voltage Vout of the current sensor 100 may be represented by:

$$V_{out} = V_{ref} - \frac{1}{C_{int}} \int_{t=0}^{\tau=T} I_s dt = V_{ref} - \frac{I_s T}{C_{int}} \qquad (1)$$

Therein, T is an integral time. In addition, the output voltage Vout of the current sensor 100 is changed as:

$$\Delta V_{out} = \frac{I_s T}{C_{int}} \qquad (2)$$

The output voltage Vout of the current sensor 100 falls linearly along with the time and is proportional to the current Is of the device to be measured, and a slope of the output voltage Vout of the current sensor 100 may be $$\frac{I_s}{C_{int}}.$$

The output voltage Vout1 of the differential amplifier (i.e., the amplifier 122) is changed as:

$$\Delta V_{out1} = \frac{I_s T}{A_2 C_{int}} \qquad (3)$$

Therein, A2 is a voltage gain of the amplifier 124. Since the voltage of the negative input terminal (−) of the amplifier 122 is nearly fixed and unchanged, a voltage change VCcs of two terminals of the compensation capacitor Ccs is equal to a voltage change output by the differential amplifier (i.e., the amplifier 122), which is:

$$\Delta VC_{cs} = \frac{I_s T}{A_2 C_{int}} \qquad (4)$$

This voltage change is caused by a current difference between two transistors of a differential pair discharging to the compensation capacitor Ccs, and a size of a current ΔI flowing through the compensation capacitor Ccs may be obtained by the following formulas:

$$\frac{1}{C_{CS}} \int_{t=0}^{\tau=T} \Delta I dt = \frac{I_s T}{A_2 C_{int}} \qquad (5)$$

-continued $$\frac{1}{C_{CS}}\Delta IT = \frac{I_s T}{A_2 C_{int}} \quad (6)$$

$$\Delta I = \frac{C_{CS}}{C_{int}} \frac{I_s}{A_2} \quad (7)$$

In comparison with the conventional Miller compensation, with the use scenario of the frequency compensation method provided by the present embodiment, the current required by the differential pair to charge or discharge to the compensation capacitor Ccs is dramatically reduced, and thus, an offset voltage Vos resulted therefrom is also much reduced. The offset voltage Vos when the voltage is in the integration phase is:

$$V_{OS} = \frac{\Delta I}{g_m} = \frac{C_{CS}}{C_{int}} \frac{I_s}{g_m A_2} \quad (8)$$

Therein, gm is a transconductance. The offset voltage Vos of the operational amplifier is reduced by a multiple of a voltage gain of the second-stage amplifier (i.e., the amplifier 124), and since the offset voltage Vos is very small, the transconductance of the differential pair is not reduced, the operational amplifier still has a high voltage gain, such that the accuracy of the current sensor 100 is not reduced. In addition, the voltage of the negative input terminal (−) of the operational amplifier is fixed to the voltage Vref, a voltage difference between two terminals of the load capacitor $C_L$ of the device to be measured remains unchanged, thus, no current flows through the load capacitor $C_L$, and the current of the device to be measured entirely flows into the voltage integration circuit 120, such that the current sensor 110 of the technique proposed herein may accurately measure the size of the current of the device to be measured.

Figure 4A:
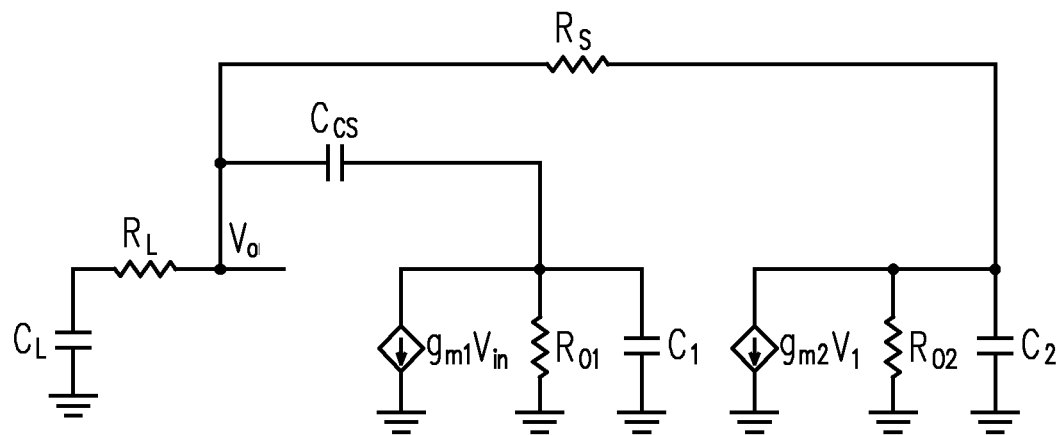
FIG. 4A is a small signal equivalent circuit diagram illustrating the current sensor when the voltage integration circuit is operated in the reset phase according to an embodiment of the invention.
Figure 4B:
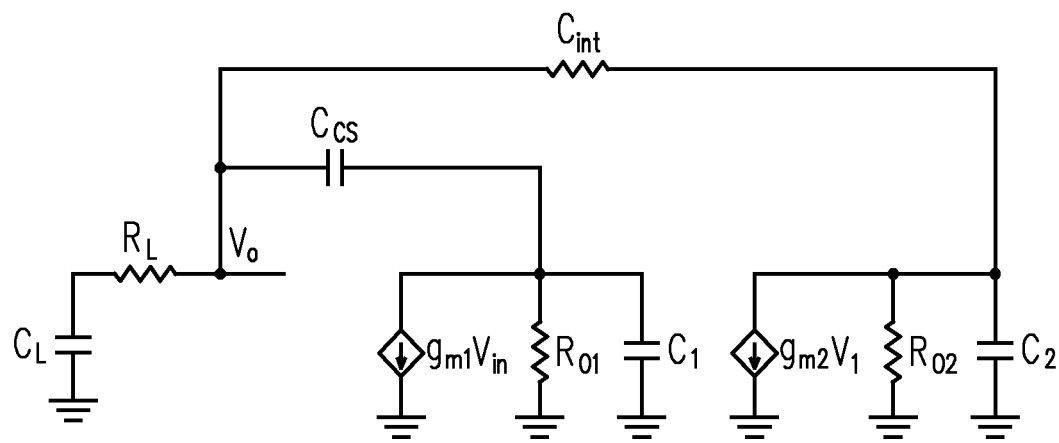
FIG. 4B is a small signal equivalent circuit diagram illustrating the current sensor when the voltage integration circuit is operated in the integration phase according to an embodiment of the invention.

FIG. 4A is a small signal equivalent circuit diagram illustrating the current sensor when the voltage integration circuit is operated in the reset phase according to an embodiment of the invention. FIG. 4B is a small signal equivalent circuit diagram illustrating the current sensor when the voltage integration circuit is operated in the integration phase according to an embodiment of the invention.

Referring to FIG. 4A, in the present embodiment, a transfer function of a circuit may be derived by using a node equation as:

$$\frac{V_o}{V_{in}} = g_{m1}R_{O1}g_{m2}R_{O2}\frac{\left(1+\frac{s}{\omega_{Z1}}\right)\left(1+\frac{s}{\omega_{Z2}}\right)\left(1+\frac{s}{\omega_{Z3}}\right)}{\left(1+\frac{s}{\omega_{P1}}\right)\left(1+\frac{s}{\omega_{P2}}\right)\left(1+\frac{s}{\omega_{P3}}\right)\left(1+\frac{s}{\omega_{P4}}\right)} \quad (9)$$

Therein, gm1 is a transconductance of the amplifier 122, gm2 is a transconductance of the amplifier 124, Ro1 is a resistance value of the amplifier 122, and Ro2 is a resistance value of the amplifier 124. In the present embodiment, Vo refers to an end point of the voltage integration circuit 120 connected to the device to be measured, and Vin refers to an input voltage.

The transfer function totally has three zero points Z1, Z2 and Z3 and four pole points P1, P2, P3 and P4, and frequencies thereof are $\omega_{Z1}$, $\omega_{Z2}$, $\omega_{Z3}$, $\omega_{P1}$, $\omega_{P2}$, $\omega_{P3}$, $\omega_{P4}$, respectively, obtained by the following formulas:

$$\omega_{Z1} \cong \frac{1}{C_L R_L - (C_{CS}/g_{m2})(1+R_S/R_{O2})} \cong \frac{1}{C_L R_L - (C_{CS}/g_{m2})} \cong \frac{1}{C_L R_L} \quad (10)$$

$$\omega_{Z2} \cong \frac{C_L R_L - (C_{CS}/q_{m2})(1+R_S/R_{O2})}{(C_{CS}/g_{m2})(C_L R_L + C_L R_L R_S/R_{O2} + C_2 R_S)} \cong -\left(\frac{g_{m2}}{C_{CS}} - \frac{1}{C_L R_L}\right) \cong -\frac{g_{m2}}{C_{CS}} \quad (11)$$

$$\omega_{Z3} \cong \frac{(C_{CS}/g_{m2})(C_L R_L + C_L R_L R_S/R_{O2} + C_2 R_S)}{(C_L C_{CS} C_2 R_L R_S/g_{m2})} \cong \frac{1}{C_2 R_S} \quad (12)$$

$$\omega_{P1} \cong \frac{1}{C_{CS}(R_{O1}+R_{O2}+g_{m2}R_{O2}R_{O1}+R_S)+C_L(R_{O2}+R_L+R_S)+C_1 R_{O1}+C_2 R_{O2}} \quad (13)$$

$$\omega_{P2} \cong \frac{\frac{1}{C_{CS}(R_{O1}+R_{O2}+g_{m2}R_{O2}R_{O1}+R_S)+C_L(R_{O2}+R_L+R_S)}}{C_{CS}(R_{O1}+R_{O2}+g_{m2}R_{O2}R_{O1}+R_S)+C_L(R_{O2}+R_L+R_S)+C_1 R_{O1}+C_2 R_{O2}} \cong \frac{g_{m2}}{C_L}+\frac{1}{C_{CS} R_{O1}}}{C_L(R_S+R_L)(C_{CS}R_{O1}+C_1 R_{O1}+C_2 R_{O2})+C_L C_{CS}(R_{O1}R_{O2}+R_L g_{m2}R_{O1}R_{O2}+R_L R_{O2}+R_L R_S)+C_{CS}R_S(C_1 R_{O1}+C_2 R_{O2})+(C_1 C_2+C_1 C_L+C_1 C_{CS}+C_2 C_{CS})R_{O1}R_{O2}} \quad (14)$$

$$\omega_{P3} \cong \frac{C_L(R_S+R_L)(C_{CS}R_{O1}+C_1 R_{O1}+C_2 R_{O2})+C_L C_{CS}(R_{O1}R_{O2}+R_L g_{m2}R_{O1}R_{O2}+R_L R_{O2}+R_L R_S)+C_{CS}R_S(C_1 R_{O1}+C_2 R_{O2})+(C_1 C_2+C_1 C_L+C_1 C_{CS}+C_2 C_{CS})R_{O1}R_{O2}}{(R_S+R_L)R_{O1}R_{O2}(C_1 C_2 C_L+C_2 C_L C_{CS})+C_L C_{CS}R_L R_S(C_1 R_{O1}+C_2 R_{O2})+C_1 C_{CS}R_{O1}R_{O2}(C_2 R_S+C_L R_L)} \cong \frac{1}{(C_1+C_2)R_L+C_2 R_S} \quad (15)$$

$$\omega_{P4} \cong \frac{(R_S+R_L)R_{O1}R_{O2}(C_1 C_2 C_L+C_2 C_L C_{CS})+C_L C_{CS}R_L R_S(C_1 R_{O1}+C_2 R_{O2})+C_1 C_{CS}R_{O1}R_{O2}(C_2 R_2+C_L R_L)}{C_L C_{CS} C_1 C_2 R_L R_S R_{O1} R_{O2}} \cong \frac{1}{C_1(R_L//R_S)}+\frac{1}{C_2 R_S} \quad (16)$$

Therein, Rs is a resistance value when the switch SW is in the turned-on state, C1 is a capacitance value of the amplifier 122, and C2 is a capacitance value of the amplifier 124. The zero point Z1 is located at the left side of an S plane, the zero point Z2 is located at the right side of an S plane, and the zero point Z3 is located at the left side of an S plane.

In the present embodiment, the main pole point is P1 which occurs to the output of the first-stage amplifier (i.e., the amplifier 122), and according to Formula (13), the compensation capacitor Ccs is equivalently amplified to be $C_{CS}(1+g_{m2}R_{O2})$.

In addition, a unit gain frequency $\omega_u$ is:

$$\omega_u \cong A_0 \omega_{P1} \cong g_{m2}R_{O2}g_{m1}R_{O1}\frac{1}{C_{CS}g_{m2}R_{O2}R_{O1}+C_L R_{O2}} \cong \quad (17)$$

$$g_{m2}R_{O2}g_{m1}R_{O1}\frac{1}{C_LR_{O2}} \cong \frac{g_{m2}}{C_L}q_{m1}R_{O1}$$

Therein, A0 is a frequency gain.

Figure 5A:
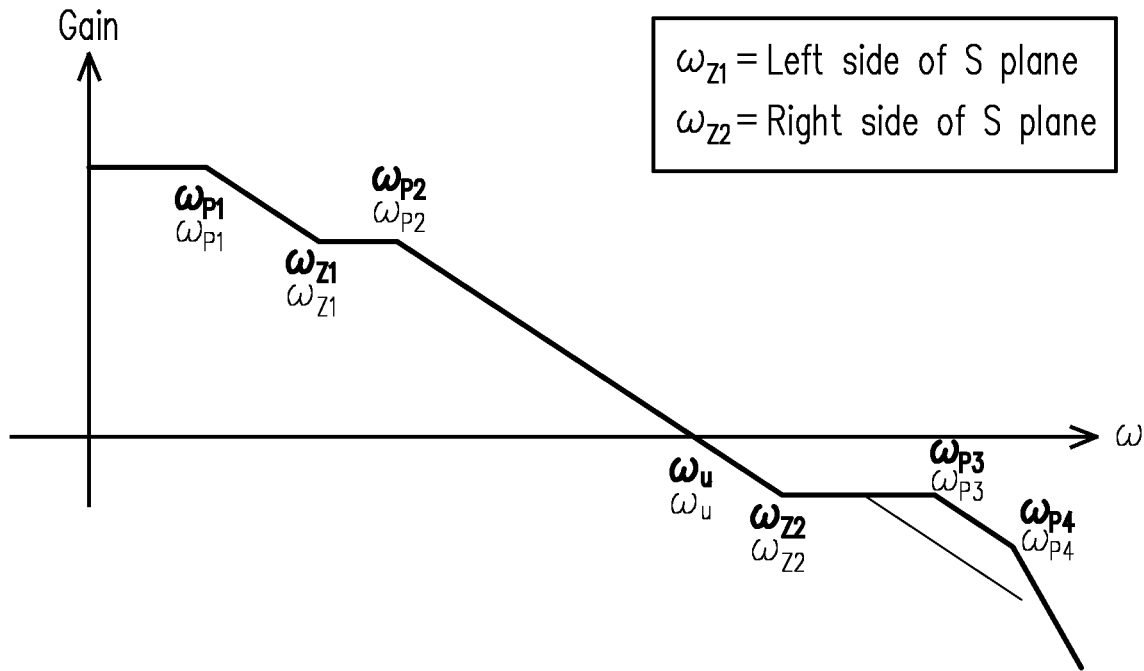
FIG. 5A is a frequency response diagram illustrating the current sensor when the voltage integration circuit is operated in the reset phase according to an embodiment of the invention.

FIG. 5A is a frequency response diagram illustrating the current sensor when the voltage integration circuit is operated in the reset phase according to an embodiment of the invention.

Referring to FIG. 5A, FIG. 5A illustrates the comparison of frequency response between a conventional voltage integration circuit and the voltage integration circuit 120 of the present embodiment when being used in the reset phase (the frequency response of the use scenario of the conventional voltage integration circuit is represented by a thin line, and the frequency response of the use scenario of the voltage integration circuit 120 of the present embodiment is represented by a bold line). According to FIG. 5A, $\omega_{P1}$, $\omega_{Z1}$, $\omega_{P2}$, $\omega_u$, $\omega_{Z2}$ are nearly the same in the use scenario of the conventional voltage integration circuit and in the use scenario of the voltage integration circuit 120 of the present embodiment when being operated in the reset phase. However, it should be noted that $\omega_{P3}$ in the use scenario of the voltage integration circuit 120 of the present embodiment in the reset phase is higher than that in the use scenario of the conventional voltage integration circuit in the reset phase. In addition, the zero point Z1 of the voltage integration circuit of the present embodiment is located at the left side of the S plane, and an increased phase thereof is offset by a phase reduced by the pole point P2, such that the voltage integration circuit 120 of the present embodiment, when being in the reset phase, may have a sufficient phase margin.

The current sensor 100, after being reset for a period of time, enters the integration phase. Referring to FIG. 4B, in the present embodiment, a transfer function of a circuit may be derived by using a node equation as:

$$\frac{V_o}{V_{in}} = A_0 \frac{\left(1+\frac{s}{\omega_{Z1}}\right)\left(1+\frac{s}{\omega_{Z2}}\right)}{\left(1+\frac{s}{\omega_{P1}}\right)\left(1+\frac{s}{\omega_{P2}}\right)\left(1+\frac{s}{\omega_{P3}}\right)} \quad (18)$$

$$A_0 = \frac{g_{m1}R_{O1}(C_{int}g_{m2}R_{O2} - C_{CS})}{C_{CS}+C_{int}+C_L} \cong g_{m1}R_{O1}g_{m2}R_{O2}\frac{C_{int}}{C_{CS}+C_{int}+C_L} \quad (19)$$

In the present embodiment, Vo refers to an end point of the voltage integration circuit 120 connected to the device to be measured, and Vin refers to an input voltage.

The transfer function totally has two zero points Z1 and Z2 and three pole points P1, P2 and P3, and frequencies thereof are $\omega_{Z1}$, $\omega_{Z2}$, $\omega_{P1}$, $\omega_{P2}$ and $\omega_{P3}$ respectively:

$$\omega_{Z1} = \frac{1}{R_LC_L} \quad (20)$$

$$\omega_{Z2} = -\frac{C_{int}g_{m2} - C_{CS}/R_{O2}}{C_{CS}(C_{int}+C_2)} \cong -\frac{g_{m2}}{C_{CS}} \quad (21)$$

$$\omega_{P1} \cong \quad (22)$$
$$\frac{1}{C_1R_{O1}+C_2R_{O2}+\dfrac{C_{CS}C_{int}}{C_{CS}+C_{int}+C_L}(R_{O2}+R_{O1}+g_{m2}R_{O2}R_{O1})+\dfrac{C_L}{C_{CS}+C_{int}+C_L}[C_{int}(R_{O2}+R_L)+C_{CS}(R_{O1}+R_L)]}$$

$$\omega_{P2} \cong \quad (23)$$

$$\frac{C_1R_{O1}+C_2R_{O2}+\dfrac{C_{CS}C_{int}}{C_{CS}+C_{int}+C_L}(R_{O2}+R_{O1}+g_{m2}R_{O2}R_{O1})+\dfrac{C_L}{C_{CS}+C_{int}+C_L}[C_{int}(R_{O2}+R_L)+C_{CS}(R_{O1}+R_L)]}{C_1C_2R_{O1}R_{O2}+\dfrac{R_{O2}R_{O1}}{C_{CS}+C_{int}+C_L}\left[\begin{array}{c}C_{CS}C_{int}(C_1+C_2+C_L)+\\ C_L(C_2C_{CS}+C_1C_{int})\end{array}\right]+\dfrac{C_{int}C_L}{C_{CS}+C_{int}+C_L}R_L\left[\begin{array}{c}C_1R_{O1}+C_2R_{O2}+\\ C_{CS}(R_{O2}+R_{O1}+g_{m2}R_{O2}R_1)\end{array}\right]}$$

$$\cong \frac{C_{CS}C_{int}g_{m2}R_{O2}+C_L(C_{int}R_{O2}+C_{CS}R_{O1})}{C_{CS}C_{int}C_LR_{O2}R_{O1}(1+g_{m2}R_L)} \cong$$

$$\frac{1}{C_LR_L}+\frac{C_{int}R_{O2}+C_{CS}R_{O1}}{C_{CS}C_{int}g_{m2}R_{O2}R_{O1}R_L}, g_{m2}R_L > 1$$

$$\omega_{P3} \cong \quad (24)$$

$$\frac{C_1C_2R_{O1}R_{O2}+\dfrac{R_{O2}R_{O1}}{C_{CS}+C_{int}+C_L}\left[\begin{array}{c}C_{CS}C_{int}(C_1+C_2+C_L)+\\ C_L(C_2C_{CS}+C_1C_{int})\end{array}\right]+\dfrac{C_{int}C_L}{C_{CS}+C_{int}+C_L}R_L\left[\begin{array}{c}C_1R_{O1}+C_2R_{O2}+\\ C_{CS}(R_{O2}+R_{O1}+g_{m2}R_{O2}R_{O1})\end{array}\right]}{\dfrac{R_{O1}R_{O2}}{C_{CS}+C_{int}+C_L}C_LR_L\left[\begin{array}{c}C_1C_2(C_{CS}+C_{int})+\\ C_{CS}C_{int}(C_1+C_2)\end{array}\right]}$$

$$\cong \frac{1+g_{m2}R_L}{R_L(C_1+C_2)}+\frac{g_{m2}}{C_1+C_2}, g_{m2}R_L > 1$$

According to Formula (22), the main pole point is P1, which is generated from dedications from the compensation capacitor Ccs and the load capacitor $C_L$.

In addition, a unit gain frequency $\omega_u$ is:

$$\omega_u \cong A_0\omega_{P1} \cong g_{m2}R_{O2}g_{m1}R_{O1}\frac{C_{int}}{C_{int}+C_L} \quad (25)$$

$$\frac{1}{C_1R_{O1}+C_2R_{O2}+\dfrac{C_{CS}C_{int}}{C_{CS}+C_{int}+C_L}(R_{O2}+R_{O1}+g_{m2}R_{O2}R_{O1})+\dfrac{C_L}{C_{CS}+C_{int}+C_L}[C_{int}(R_{O2}+R_L)+C_{CS}(R_{O1}+R_L)]} \cong g_{m1}$$

$$R_{O1}\frac{g_{m2}}{C_L}$$

Figure 5B:
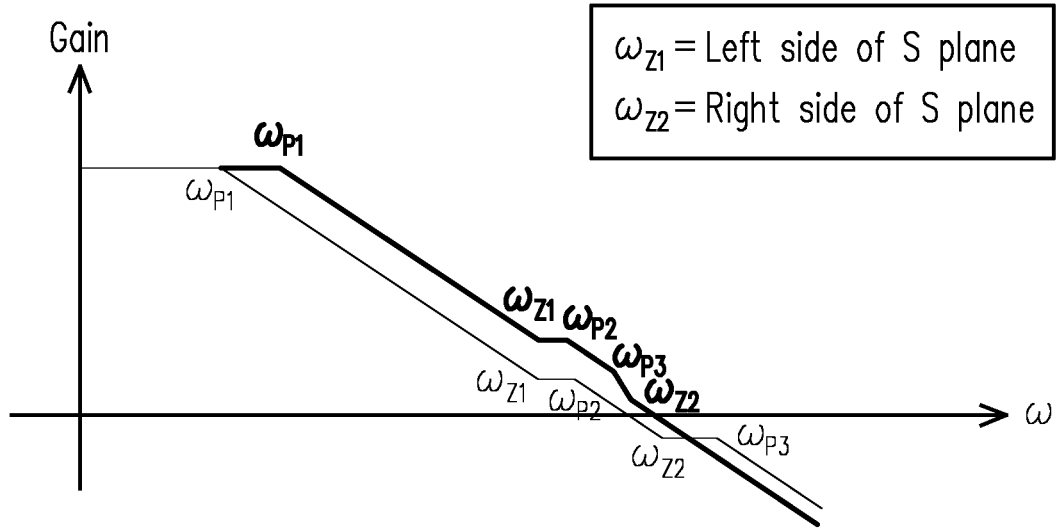
FIG. 5B is a frequency response diagram illustrating the current sensor when the voltage integration circuit is operated in the integration phase according to an embodiment of the invention.

FIG. 5B is a frequency response diagram illustrating the current sensor when the voltage integration circuit is operated in the integration phase according to an embodiment of the invention.

Referring to FIG. 5B, FIG. 5B illustrates the comparison of frequency response between a conventional voltage integration circuit and the voltage integration circuit 120 of the present embodiment when being used in the integration phase (the frequency response of the use scenario of the conventional voltage integration circuit is represented by a thin line, and the frequency response of the use scenario of the voltage integration circuit 120 of the present embodiment is represented by a bold line). According to FIG. 5B, the zero point Z1 of the voltage integration circuit of the present embodiment is located at the left side of the S plane, and an increased phase thereof is offset by a phase reduced by the pole point P2, such that the voltage integration circuit 120 of the present embodiment, when being in the integration phase, may have an sufficient phase margin and have a greater frequency bandwidth and a high stability, such that the accuracy of the current sensor sensing the current may be enhanced.

Based on the above, in the embodiments of the invention, the voltage integration circuit includes the operational amplifier having the two-stage amplifiers, the compensation capacitor is disposed between the negative input terminal (−) of the first-stage amplifier (i.e., the differential amplifier) and the output terminal of the first-stage amplifier. Based on this circuit architecture, the input voltage of the negative input terminal (−) of the first-stage amplifier can be fixed to a certain reference voltage (approximate to the input voltage of positive input terminal (+) of the first-stage amplifier), such that the voltage integration circuit of the present embodiment is operated either in the reset phase or in the integration phase, the input voltage of the negative input terminal (−) of the first-stage amplifier is not changed, such that the current to be sensed of the device to be measured is not affected, and the current to be sensed completely flows into the voltage integration circuit, the operational amplifier can keep having the high voltage gain, such that the accuracy of the current sensor sensing the current can be enhanced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A current sensor, comprising:
  a voltage generation circuit, configured to generate a first voltage according to a current to be sensed; and
  a voltage integration circuit, coupled to the voltage generation circuit, and configured to receive the first voltage and a second voltage to generate an output voltage,
  wherein the voltage integration circuit comprises:
    a first amplifier, configured to receive the first voltage and the second voltage to generate a third voltage;
    a second amplifier, coupled to the first amplifier, and configured to receive the third voltage to generate the output voltage;
    a first capacitor, coupled between an output terminal of the voltage generation circuit and an output terminal of the first amplifier, and configured to reduce a voltage difference between the first voltage and the second voltage; and
    a second capacitor, coupled between the output terminal of the voltage generation circuit and an output terminal of the second amplifier.

2. The current sensor according to claim 1, wherein the voltage integration circuit further comprises:
  a switch, coupled between the output terminal of the voltage generation circuit and the output terminal of the second amplifier.

3. The current sensor according to claim 2, wherein the switch is in a turned-on state when the voltage integration circuit is operated in a reset phase, and the switch is in a turned-off state when the voltage integration circuit is operated in an integration phase.

4. The current sensor according to claim 3, wherein when the switch is in the turned-on state, the output terminal of the second amplifier is connected to the output terminal of the voltage generation circuit to form a negative feedback loop, and the first capacitor is connected to the output terminal of the second amplifier through the turned-on switch to form a Miller compensation.

5. The current sensor according to claim 3, wherein when the switch is in the turned-off state, the first capacitor and the second capacitor are connected in series between an input terminal and the output terminal of the second amplifier to form a Miller compensation.

6. The current sensor according to claim 2, wherein the switch is a resistor.

7. The current sensor according to claim 1, wherein the first amplifier is a differential amplifier having a positive input terminal and a negative input terminal, the negative input terminal receives the first voltage, and the positive input terminal receives the second voltage.

8. The current sensor according to claim 1, wherein the second amplifier is a single output amplifier having an inverting gain and having a negative input terminal, and the negative input terminal is coupled to the output terminal of the first amplifier.

9. The current sensor according to claim 1, wherein the voltage generation circuit comprises a current source, a resistor and a third capacitor,
  wherein a terminal of the current source is coupled to a working voltage, another terminal of the current source is coupled to a terminal of the resistor and a terminal of the third capacitor, another terminal of the third capacitor is coupled to a ground voltage, and another terminal of the resistor is coupled to the voltage integration circuit.

10. The current sensor according to claim 1, wherein the current sensor is applied to a display panel.

11. A frequency compensation method of a current sensor, comprising:
  generating a first voltage according to a current to be sensed by a voltage generation circuit; and
  receiving the first voltage and a second voltage by a voltage integration circuit coupled to the voltage generation circuit to generate an output voltage,
  wherein the step of receiving the first voltage and the second voltage by the voltage integration circuit to generate the output voltage comprises:
    receiving the first voltage and the second voltage by a first amplifier to generate a third voltage;
    receiving the third voltage by a second amplifier coupled to the first amplifier to generate the output voltage; and
    reducing a voltage difference between the first voltage and the second voltage by a first capacitor coupled between an output terminal of the voltage generation circuit and an output terminal of the first amplifier,
    wherein the voltage integration circuit further comprises a second capacitor, coupled between the output terminal of the voltage generation circuit and an output terminal of the second amplifier.

12. The frequency compensation method according to claim 11, wherein the voltage integration circuit further comprises: a switch, coupled between the output terminal of the voltage generation circuit and the output terminal of the second amplifier.

13. The frequency compensation method according to claim 12, wherein the switch is in a turned-on state when the voltage integration circuit is operated in a reset phase, and the switch is in a turned-off state when the voltage integration circuit is operated in an integration phase.

14. The frequency compensation method according to claim 13, wherein when the switch is in the turned-on state, the output terminal of the second amplifier is connected to the output terminal of the voltage generation circuit to form a negative feedback loop, and the first capacitor is connected to the output terminal of the second amplifier through the turned-on switch to form a Miller compensation.

15. The frequency compensation method according to claim 13, wherein when the switch is in the turned-off state, the first capacitor and the second capacitor are connected in series between an input terminal and the output terminal of the second amplifier to form a Miller compensation.

16. The frequency compensation method according to claim 12, wherein the switch is a resistor.

17. The frequency compensation method according to claim 11, wherein the first amplifier is a differential amplifier having a positive input terminal and a negative input terminal, the first voltage is received by the negative input terminal, and the second voltage is received by the positive input terminal.

18. The frequency compensation method according to claim 11, wherein the second amplifier is a single output amplifier having an inverting gain and having a negative input terminal, and the negative input terminal is coupled to the output terminal of the first amplifier.

19. The frequency compensation method according to claim 11, wherein the voltage generation circuit comprises a current source, a resistor and a third capacitor, a terminal of the current source is coupled to a working voltage, another terminal of the current source is coupled to a terminal of the resistor and a terminal of the third capacitor, another terminal of the third capacitor is coupled to a ground voltage, and another terminal of the resistor is coupled to the voltage integration circuit.

20. The frequency compensation method according to claim 11, wherein the current sensor is applied to a display panel.

* * * * *